(12) United States Patent
Kondo

(10) Patent No.: US 8,810,200 B2
(45) Date of Patent: Aug. 19, 2014

(54) LOAD SYSTEM

(71) Applicant: Tatsumi Corporation, Tokyo (JP)

(72) Inventor: Toyoshi Kondo, Tokyo (JP)

(73) Assignee: Tatsumi Corporation, Tokyo (JP)

( * ) Notice: Subject to any disclaimer, the term of this patent is extended or adjusted under 35 U.S.C. 154(b) by 0 days.

(21) Appl. No.: 14/098,149

(22) Filed: Dec. 5, 2013

(65) Prior Publication Data

US 2014/0091762 A1    Apr. 3, 2014

Related U.S. Application Data

(63) Continuation of application No. PCT/JP2011/072868, filed on Oct. 4, 2011.

(30) Foreign Application Priority Data

Jun. 9, 2011    (JP) ................... 2011-129084

(51) Int. Cl.
*H02J 7/00* (2006.01)
*H02J 7/14* (2006.01)
*G01N 27/416* (2006.01)
*H02J 1/00* (2006.01)
*G01R 31/36* (2006.01)
*B60L 11/18* (2006.01)
*G01R 31/40* (2014.01)

(52) U.S. Cl.
CPC .......... *H02J 7/0024* (2013.01); *G01R 31/3631* (2013.01); *B60L 11/1851* (2013.01); *G01R 31/40* (2013.01)
USPC ........... 320/117; 320/104; 320/109; 324/429; 307/11

(58) Field of Classification Search
CPC ............... G01R 31/3631; G01R 19/16542; Y02T 10/7077
USPC ............. 320/104, 109; 324/429; 307/11
See application file for complete search history.

(56) References Cited

U.S. PATENT DOCUMENTS

| | | | | |
|---|---|---|---|---|
| 4,135,101 A | * | 1/1979 | Young et al. | 307/39 |
| 4,151,454 A | * | 4/1979 | Iida | 320/134 |
| 4,697,134 A | * | 9/1987 | Burkum et al. | 320/134 |
| 5,281,920 A | * | 1/1994 | Wurst | 324/430 |
| 6,144,185 A | * | 11/2000 | Dougherty et al. | 320/132 |
| 6,167,349 A | * | 12/2000 | Alvarez | 702/63 |

(Continued)

FOREIGN PATENT DOCUMENTS

| | | |
|---|---|---|
| CN | 1339113 A | 3/2002 |
| CN | 101587137 A | 11/2009 |

(Continued)

OTHER PUBLICATIONS

International Search Report in corresponding PCT/JP2011/072868 mailed Dec. 13, 2011 (4 pages).

(Continued)

*Primary Examiner* — M'Baye Diao
(74) *Attorney, Agent, or Firm* — Osha Liang LLP

(57) ABSTRACT

A load system includes a power supply input unit for load test of an external power supply, a charging circuit or a charger to which electric power from the power supply is supplied via the power supply input unit, a plurality of loads to which the electric power from the charging circuit or the charger is supplied, and a control circuit that switches selectively and connects the plurality of loads to the charging circuit or the charger. The plurality of loads is a plurality of storage batteries as a load resistance. The control circuit is configured to switch selectively and connect the plurality of storage batteries to the charging circuit or the charger such that the storage battery connected to the charging circuit or the charger among the plurality of storage batteries is charged by the charging circuit or the charger.

14 Claims, 17 Drawing Sheets

(56) References Cited

U.S. PATENT DOCUMENTS

| | | | |
|---|---|---|---|
| 6,653,928 B1 | 11/2003 | Kondo | |
| 7,075,305 B2 * | 7/2006 | Nakamura et al. | 324/430 |
| 7,580,775 B2 * | 8/2009 | Kulyk et al. | 700/296 |
| 7,902,828 B2 * | 3/2011 | Huang | 324/430 |
| 8,030,881 B2 * | 10/2011 | Owens et al. | 320/104 |
| 2002/0008523 A1 * | 1/2002 | Klang | 324/429 |

FOREIGN PATENT DOCUMENTS

| | | |
|---|---|---|
| CN | 201556950 U | 8/2010 |
| JP | 57-14065 A | 1/1982 |
| JP | 5-85150 U | 11/1993 |
| JP | 2010-25752 A | 2/2010 |

OTHER PUBLICATIONS

Office Action in corresponding Chinese Application No. 201180071225.0, dated Jun. 23, 2014 (6 pages).

Chinese Search Report in corresponding Chinese Application No. 2011800712250, dated Jun. 13, 2014 (4 pages).

\* cited by examiner

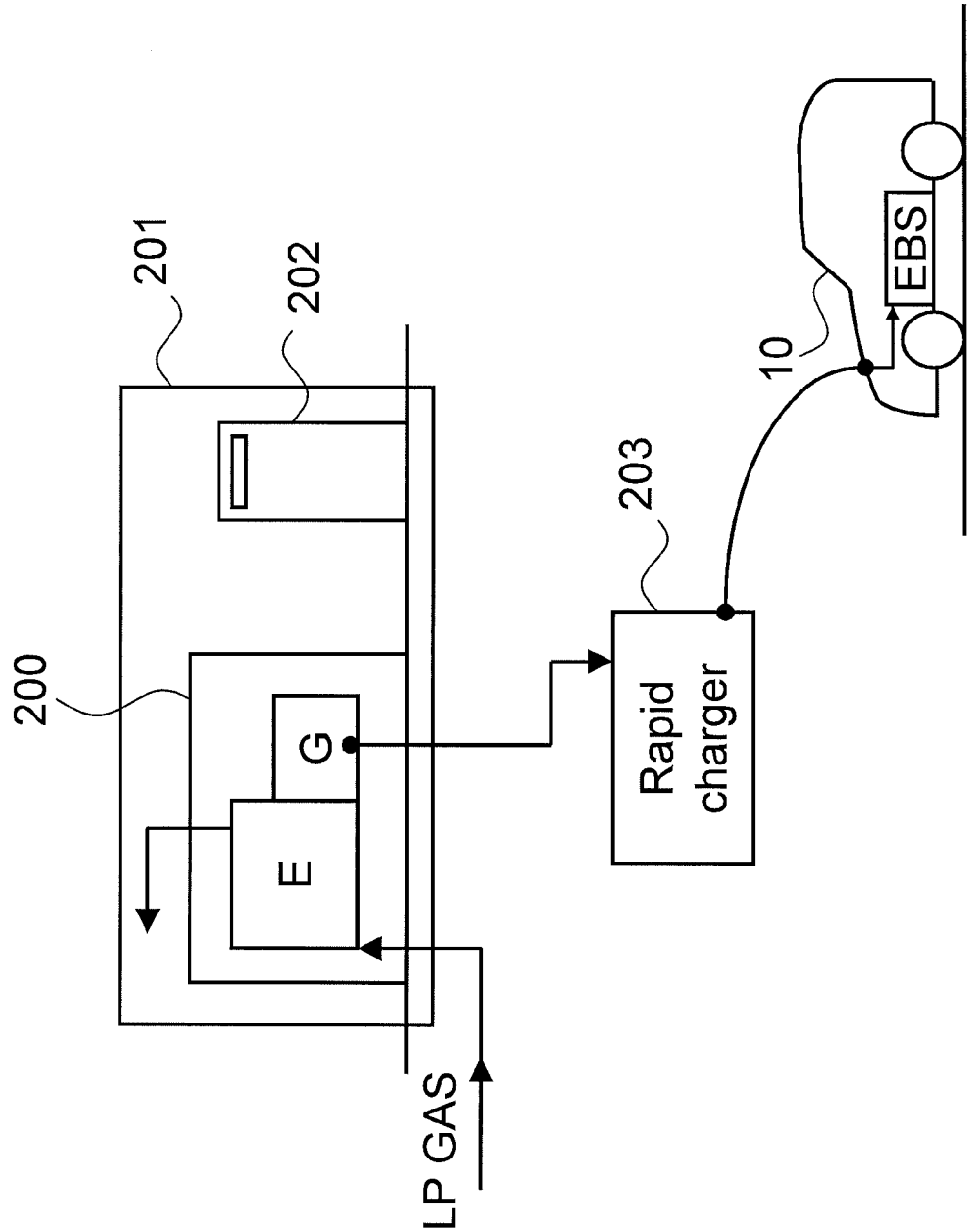

LOAD SYSTEM

CROSS-REFERENCE TO RELATED APPLICATION

The present application is a continuation of International Patent Application No. PCT/JP2011/072868 filed on Oct. 4, 2011, which claims priority from Japanese Patent Application No. 2011-129084 filed to Japan Patent Office on Jun. 9, 2011. The entire content of which is incorporated herein by reference completely.

TECHNICAL FIELD

The present invention relates to a load system that includes a load resistance for a load test.

BACKGROUND ART

Conventionally, as a load test apparatus, it is known that a dry load test apparatus performs a load test corresponding to an output of a power supply by selectively switching a connection condition of a series connection and a parallel connection of a plurality of load resistances (for example, see Patent Literature 1).

CITATION LIST

Patent Literature

Patent Literature 1: JP 2010-25752 A

SUMMARY OF INVENTION

Technical Problem

However, electric power energy was conventionally dissipated as thermal energy at a load resistance such that electric power energy was wasted.

Accordingly, an object of the invention is to provide a load system capable of reducing electric power energy wastefully consumed in a load test.

Solution to Problem

In order to achieve the above object, a load system of the invention includes: a power supply input unit for load test of an external power supply; a load that includes a plurality of storage batteries as a plurality of load resistances connected to the power supply input unit; and a control circuit configured to switch selectively and connect the plurality of load resistances to the power supply input unit.

Advantageous Effects of Invention

This configuration is capable of reducing electric power energy wastefully consumed in the load test.

BRIEF DESCRIPTION OF DRAWINGS

FIG. 17 is an explanatory view where an example of a rapid charging system using the load system according to the invention is illustrated.

DESCRIPTION OF EMBODIMENTS

With reference to the drawings, an embodiment of this invention will be described below.

First Embodiment (Configuration)

FIGS. 1 to 4 illustrate an installation type load system as an example of a load test apparatus (load system) A according to this invention.

Figure 1:
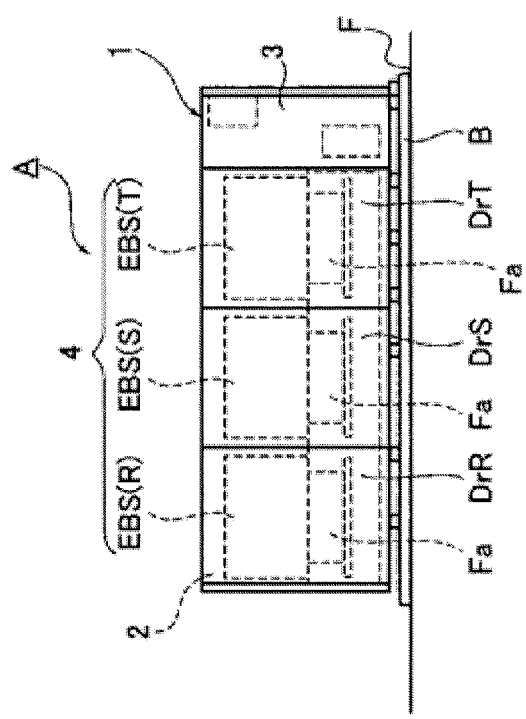
FIG. 1 is a side view of a load system according to the invention.
Figure 2:
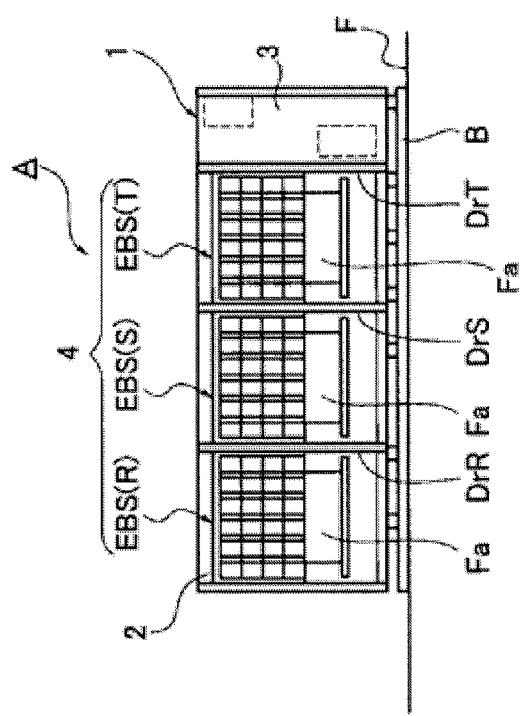
FIG. 2 is a side view where an opened state of a door of the load system of FIG. 1 is illustrated.

In FIGS. 1 and 2, reference symbol F denotes a floor surface in a building (not shown). Reference symbol B denotes a base disposed on the floor surface F. In FIGS. 1 to 4, reference numeral 1 denotes a load storage case fixed to the base B. Reference numeral 2 denotes a load storage unit provided in the load storage case 1. Reference numeral 3 denotes a control panel provided in the load storage case 1. Doors DrR, DrS, and DrT are provided on the side of the load storage case 1 for opening and closing the load storage unit 2. Opening the doors DrR, DrS, and DrT opens the load storage unit 2 as illustrated in FIG. 2. The doors DrR, DrS, and DrT are illustrated at only one side of the side portion of the load storage case 1. However, the doors DrR, DrS, and DrT are also provided on the other side of the side portion.

Figure 3:
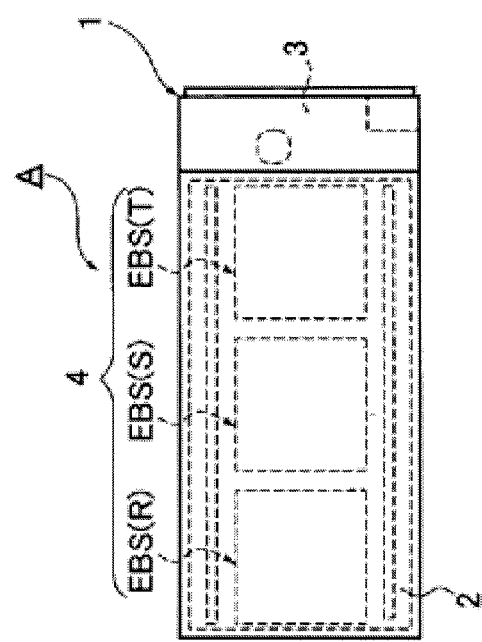
FIG. 3 is a plane view of FIG. 1.

As shown in FIGS. 1 to 3, a resistance unit 4, which is used as a load resistance of a load test, is housed inside of the load storage unit 2. The resistance unit 4 includes a storage battery unit EBS(R) as a R-phase load resistance, a storage battery unit EBS(S) as a S-phase load resistance, and a storage battery unit EBS(T) as a T-phase load resistance, so as to perform the load test of a three-phase AC power supply. Each of the storage battery units EBS(R), EBS(S), and EBS(T) as the load resistance has the same configuration. Therefore, the storage battery units EBS(R), EBS(S), and EBS(T) will be described directly or simply as the storage battery unit EBS.

The storage battery unit EBS includes a plurality of storage batteries (secondary batteries) EBS(1) . . . EBS(i), . . . EBS(n).

The plurality of storage batteries (secondary batteries) EBS (1) ... EBS(i), ... EBS(n) are attached removably (replaceable) inside of the load storage unit 2 of the load storage case 1. The storage battery unit EBS includes an auxiliary storage battery (secondary battery) EBS(AX).

As a structure for attaching removably (replaceably) the plurality of storage batteries EBS(1), ... EBS(i), ... EBS(n) to the load storage unit 2, a known technique can be used. Thus, a detailed description is omitted. Also, the storage batteries EBS(1) ... EBS(i), ... EBS(n), the auxiliary storage battery (secondary battery) EBS(AX), and the like are removable in a state where the load storage unit 2 is opened by opening the doors DrR, DrS, and DrT as illustrated in FIG. 2.

The storage batteries EBS(1), ... EBS(i), ... EBS(n) for the R-phase, S-phase, and T-phase resistance units are used for the load test of the power supply changing the condition of the load (voltage) of the power supply by switching the connection, similarly to, for example, a plurality of rod-shaped resistors described in JP 2010-25752 A (known literature). The method of the load test is not the fundamental part of the invention. Thus, a detailed description is omitted.

The storage batteries EBS(1), ... EBS(i), ... EBS(n) for R-phase, S-phase and T-phase resistance units are used for the load test of the power supply facility PS such as an emergency power generator and an uninterruptible power supply apparatus (UPS) in FIG. 4 by switching connection, similarly to, for example, a plurality of resistors (resistances) of R-phase, S-phase, and T-phase resistance units as described in JP 2010-25752 A (resistance units of reference numerals 42, 43, and 44 in this Patent Literature). The power supply facility PS for performing the load test includes a suspended thermal power generator for use in an emergency or a suspended nuclear power generator and the like. The other power supply facility PS for performing the load test may include a wind power generator, a solar panel (solar power generation apparatus), and the like.

Figure 4:
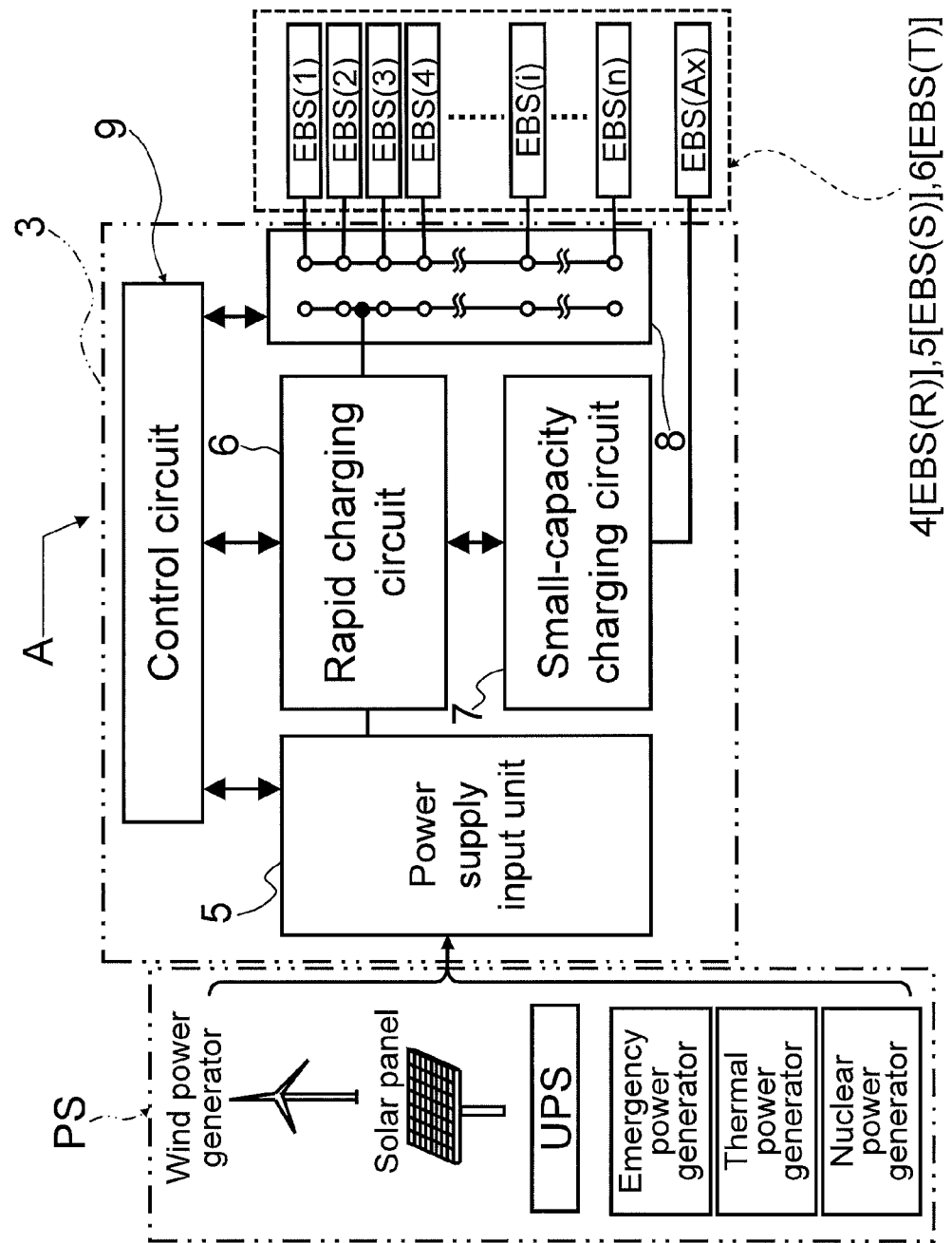
FIG. 4 is a charging circuit diagram of the load system of FIGS. 1 to 3.

As shown in FIG. 4, the control panel 3 includes a power supply input unit 5, a rapid charging circuit 6, a small-capacity charging circuit 7, a connection switching circuit 8, and a control circuit 9. The control circuit 9 controls the power supply input unit 5, the rapid charging circuit 6, the small-capacity charging circuit 7, and the connection switching circuit 8.

The control circuit 9 operationally controls the connection switching circuit 8 for the connection switching circuit 8 to select the storage batteries EBS(1), ... EBS(i), ... EBS(n) as charging objects by the rapid charging circuit 6. Also, the control circuit 9 controls the connection switching circuit 8 to change the connection condition of the selected storage batteries EBS(1), ... EBS(i), ... EBS(n). This allows charging voltage and charging current by the rapid charging circuit 6 to correspond to specifications of the charging voltages and the charging currents of the storage batteries EBS(1), ... EBS(i), ... EBS(n). The charging voltage and the charging current are set to an optimum value or a value close to this optimum value for charging each of the storage batteries EBS(1), ... EBS(i), ... EBS(n). This setting is different depending on the type of battery used for the storage batteries EBS(1), ... EBS(i), ... EBS(n). In this embodiment, as the storage batteries EBS(1), ... EBS(i), ... EBS(n), for example, a lithium ion secondary battery, a nickel cadmium storage battery, a lithium polymer secondary battery, and similar secondary battery may be used.

The rapid charging circuit 6 is used for rapid charging of the storage batteries EBS(1), ... EBS(i), ... EBS(n). The small-capacity charging circuit 7 is used for charging of the auxiliary storage battery EBS(AX). The small-capacity charging circuit 7 is used for fine adjustment of the charging voltage and the charging current by the rapid charging circuit 6. This fine adjustment is controlled by the control circuit 9.

The storage batteries EBS(1), ... EBS(i), ... EBS(n) for the respective storage battery units EBS(R), EBS(S), and EBS(T) are provided with a gap (not shown) serving as an air passage to an adjacent part. These storage batteries EBS(1), ... EBS(i), ... EBS(n) are configured to be air-cooled by air blown toward the upper side of a cooling fan Fa in the lower side of the each of the storage battery units EBS(R), EBS(S), and EBS(T).

(Operation)

Next, an operation of the load test apparatus (load system) A of this configuration will be described.

The load test apparatus A is installed and used as an installation type in a place or inside of a building with a power supply facility PS.

As described above, the power supply facility PS includes the emergency power generator, the uninterruptible power supply apparatus (UPS), the suspended thermal power generator for use in an emergency, the suspended nuclear power generator, the wind power generator, the solar panel (solar power generation apparatus), and the like in FIG. 4. The power supply facility PS such as the emergency power generator and the uninterruptible power supply apparatus (UPS) are installed in buildings of other public facilities such as a hospital building, a railway facility, an airport facility, and a building with data bank of the bank.

Then, the load test of the power supply facility PS is performed periodically by the load test apparatus A. In the load test, the storage batteries EBS(1), ... EBS(i), ... EBS(n) and the auxiliary storage battery EBS(AX) of the load test apparatus A are charged by electric power. This electric power is supplied from the power supply facility PS such as the emergency power generator, the uninterruptible power supply apparatus (UPS), the thermal power generator, the nuclear power generator, and the like via the rapid charging circuit 6 and the small-capacity charging circuit 7.

In this case, the cooling fan Fa is operated. The cooling air from the cooling fan Fa flows around the storage batteries EBS(1), ... EBS(i), ... EBS(n) and the auxiliary storage battery EBS(AX). The cooling air cools the storage batteries EBS(1), ... EBS(i), ... EBS(n) and the auxiliary storage battery EBS(AX), which generate heat by charging.

Figure 5:
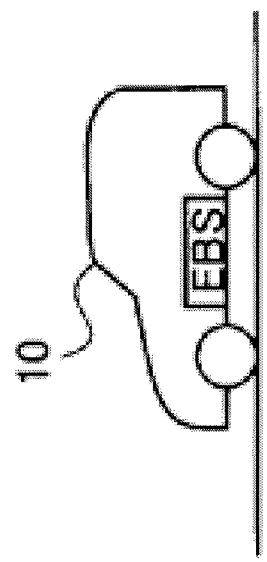
FIG. 5 is an explanatory view applying a storage battery of FIG. 4 to a vehicle.

In the load test, conventionally, the electric power supplied from the power supply facility PS was consumed solely by a resistor as thermal energy. In contrast, in this embodiment, the electric power supplied from the power supply facility PS is stored by charging the storage batteries EBS(1), ... EBS(i), ... EBS(n) and the auxiliary storage battery EBS(AX). Accordingly, the electric power supplied from the power supply facility PS is not consumed wastefully by throwing away. The electric power can be utilized effectively by using as the storage battery EBS of an EV car (electric vehicle) 10 of FIG. 5, a power supply of a building 11 of housing, and the like of FIG. 6.

Figure 6:
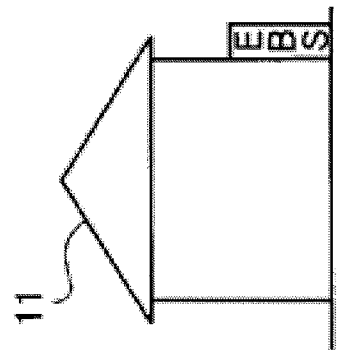
FIG. 6 is an explanatory view applying a storage battery of FIG. 4 to a housing.

That is, the storage batteries EBS(1), ... EBS(i), ... EBS(n) and the auxiliary storage battery EBS(AX) that are charged are set to the same standard with the storage battery EBS of the EV car (electric vehicle) 10 illustrated in FIG. 5. Accordingly, after charging the storage batteries EBS(1), ... EBS(i), ... EBS(n) and the auxiliary storage battery EBS(AX), the storage batteries EBS(1), ... EBS(i), ... EBS(n) and the auxiliary storage battery EBS(AX) are extracted from the load storage unit 2 and allow being used as the battery EBS of the EV car (electric vehicle) 10. The storage batteries EBS(1), ... EBS(i), ... EBS(n) and the auxiliary storage battery EBS(AX) are used as the power supply of the building 11 of the housing and the like as illustrated in FIG. 6.

In the case where the load test is not performed, the load test apparatus A is used as a charging apparatus. In this case, in the case where the electric power is supplied from the emergency power generator, the uninterruptible power supply apparatus (UPS), the suspended thermal power generator for use in an emergency, the suspended nuclear power generator, the wind power generator, the solar panel (solar power generation apparatus), and the like in FIG. 4 to the load of an electrical device, an electronic device, or the like inside of a building, the surplus electric power left in a state of use of the load of the electrical device, the electronic device, or the like is charged to the storage batteries EBS(1), . . . EBS(i), . . . EBS(n) and the auxiliary storage battery EBS(AX) by using the load test apparatus A as the charging apparatus. This allows preventing unnecessary energy consumption. The electric power charged to the storage batteries EBS(1), . . . EBS(i), . . . EBS(n) and the auxiliary storage battery EBS (AX) can be utilized by being supplied to the load of the electrical device, the electronic device, or the like inside of the building.

As the load test apparatus A, in order to accommodate the three-phase AC power supply, an example where the R-phase, S-phase, and T-phase resistance units are provided is disclosed. However, in the case where the power supply is a single phase AC or a DC, the load test apparatus A may use one among the R-phase, S-phase, and T-phase resistance units.

Instead of the periodical load test, in order to charge the storage batteries EBS(1), . . . EBS(i), . . . EBS(n) and the auxiliary storage battery EBS(AX), the load test apparatus A may be continuously operated. In this case, the load test of the power supply facility PS can be performed constantly while charging the storage batteries EBS(1), . . . EBS(i), . . . EBS(n) and the auxiliary storage battery EBS(AX).

Second Embodiment

Figure 7:
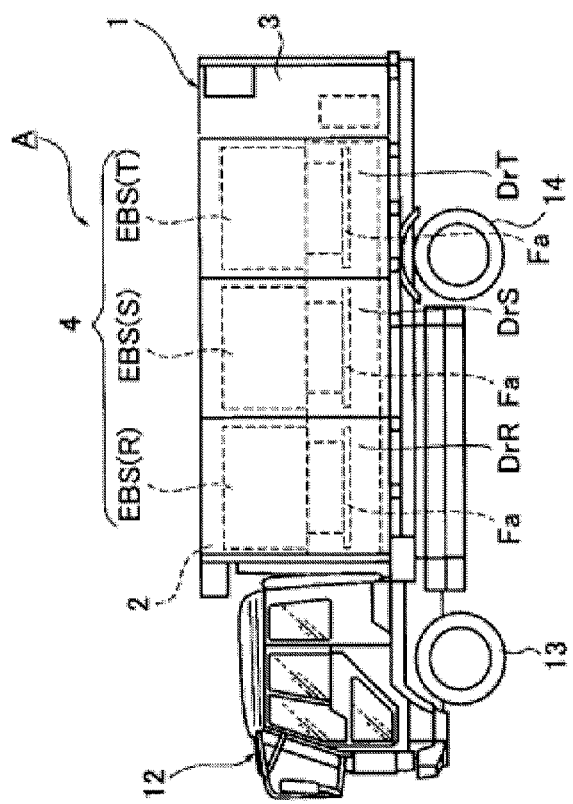
FIG. 7 is a side view of a vehicle equipped with the load system illustrated in FIG. 1.
Figure 8:
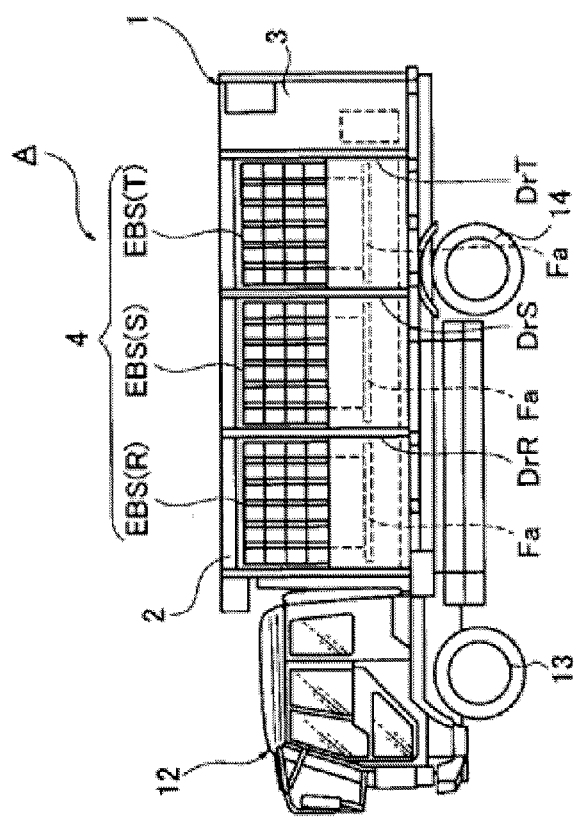
FIG. 8 is a side view where an opened state of a door of the load system of the vehicle of FIG. 7 is illustrated.
Figure 9:
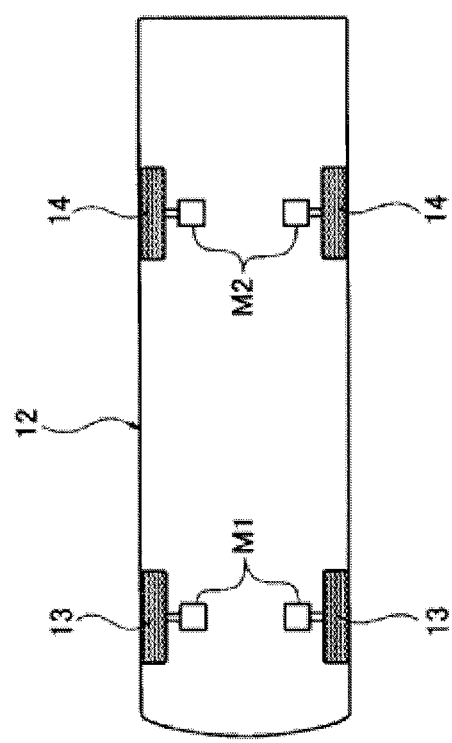
FIG. 9 is an explanatory view of an electrically driven vehicle provided with a wheel driven by a storage battery of the load system of FIG. 7.

While in the aforementioned embodiment, the load test apparatus (load system) A is installed and used, this should not be construed in a limiting sense. For example, as illustrated in FIGS. 7 and 8, the load test apparatus (load system) A of FIGS. 7 to 10 may be mounted on a vehicle 12 such as a truck and moved. In the vehicle 12 of FIG. 9, the truck is employed and provided with a front wheel (wheel) 13 and a rear wheel (wheel) 14, which can be driven by wheel drive motors M1 and M2. The vehicle 12 is an EV car (electric vehicle).

Figure 10:
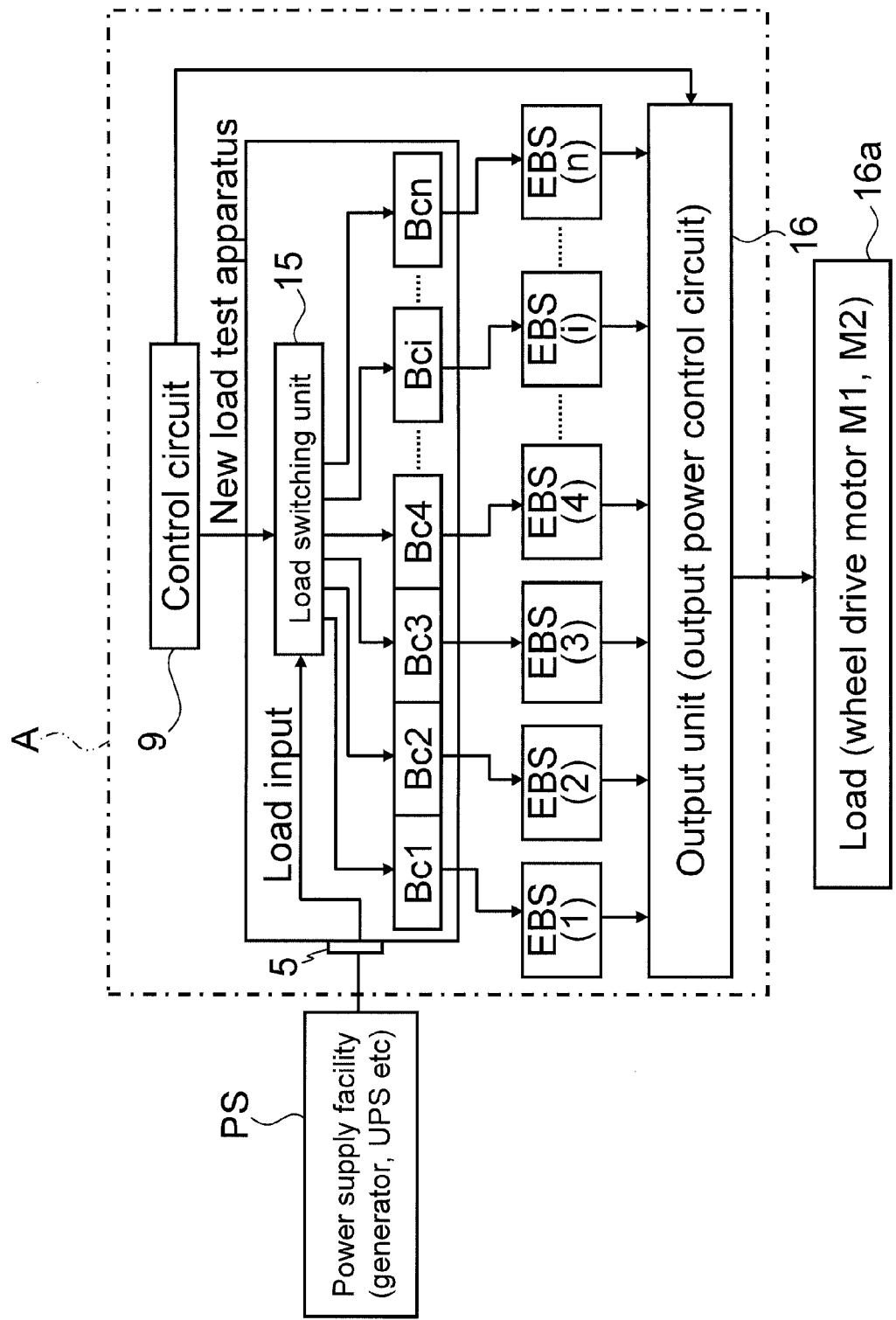
FIG. 10 is a charging circuit diagram of the electrically driven vehicle of FIG. 9.

As illustrated in FIG. 10, the load test apparatus A is configured as follows. The power supply (electric power) that is supplied from the power supply facility PS is input to a load switching unit 15 via the power supply input unit 5. As illustrated in FIG. 10, the load switching unit 15 connects to a plurality of the chargers (Bc1, . . . Bci, . . . Bcn). The plurality of chargers (Bc1, . . . Bci, . . . Bcn) connect to the plurality of storage batteries (EBS(1), . . . EBS(i), . . . EBS(n)). The load switching unit 15 is controlled operationally by the control circuit 9. The load switching unit 15 switches a plurality of chargers (Bc1, . . . Bci, . . . Bcn). The load switching unit 15 is configured to supply the charging voltage and the charging current to a storage battery EBS(i) (i=1, 2, . . . n) connected to the charger (Bc1, . . . Bci, . . . Bcn). In the charger (Bc1, . . . Bci, . . . Bcn), a known rapid charger can be used. Thus, detailed description of the charger (Bc1, . . . Bci, . . . Bcn) is omitted.

The electric power from the storage battery EBS(i) is supplied to a load (including, for example, an air conditioner, a meter, a lamp, and the wheel drive motors M1 and M2) 16a as a power supplied unit via an output power control circuit (output unit) 16 of FIG. 10. The output power control circuit (output unit) 16 is a vehicle control circuit of the vehicle 12, which is the EV car, and includes an inverter that supplies the drive power to the wheel drive motors M1 and M2. In the configuration of the control circuit that drives and controls the wheel drive motors M1 and M2, the known drive circuits of the EV car may be employed. Thus, detailed description is omitted.

Third Embodiment

Figure 11:
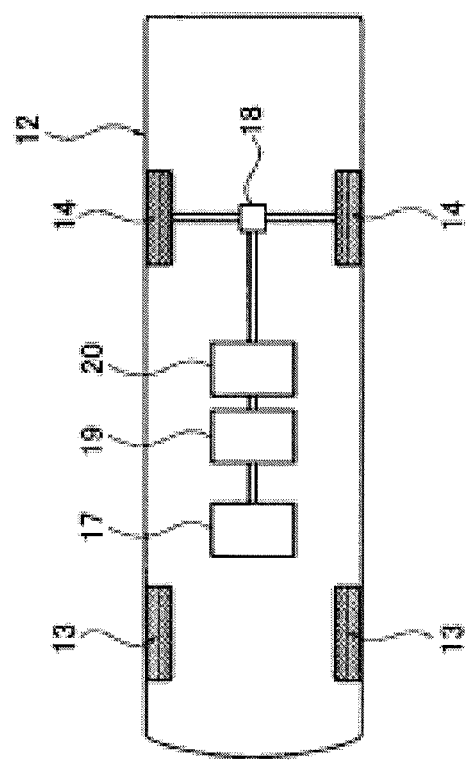
FIG. 11 is an explanatory view of a hybrid car provided with a wheel driven by a storage battery of the load system of FIG. 7.

While in the aforementioned second embodiment, an example that is assumed to use the storage battery EBS(i) as a battery of the vehicle 12 of the EV car (electric vehicle), this should not be construed in a limiting sense. For example, as illustrated in FIG. 11, the storage battery EBS(i) may be used as a battery of a hybrid car that can be driven by an engine 17. The hybrid car includes a series-type and a parallel-type hybrid car.

FIG. 11 illustrates a vehicle 12 that is the parallel-type hybrid car as an example of the hybrid car. In the vehicle 12 of FIG. 11, the rotational force is transmitted to the left and right rear wheels 14 and 14 by a differential apparatus 18. Also, the rotation of the engine 17 is transmitted to the differential apparatus 18 via a motor 19 and a transmission 20.

Figure 12:
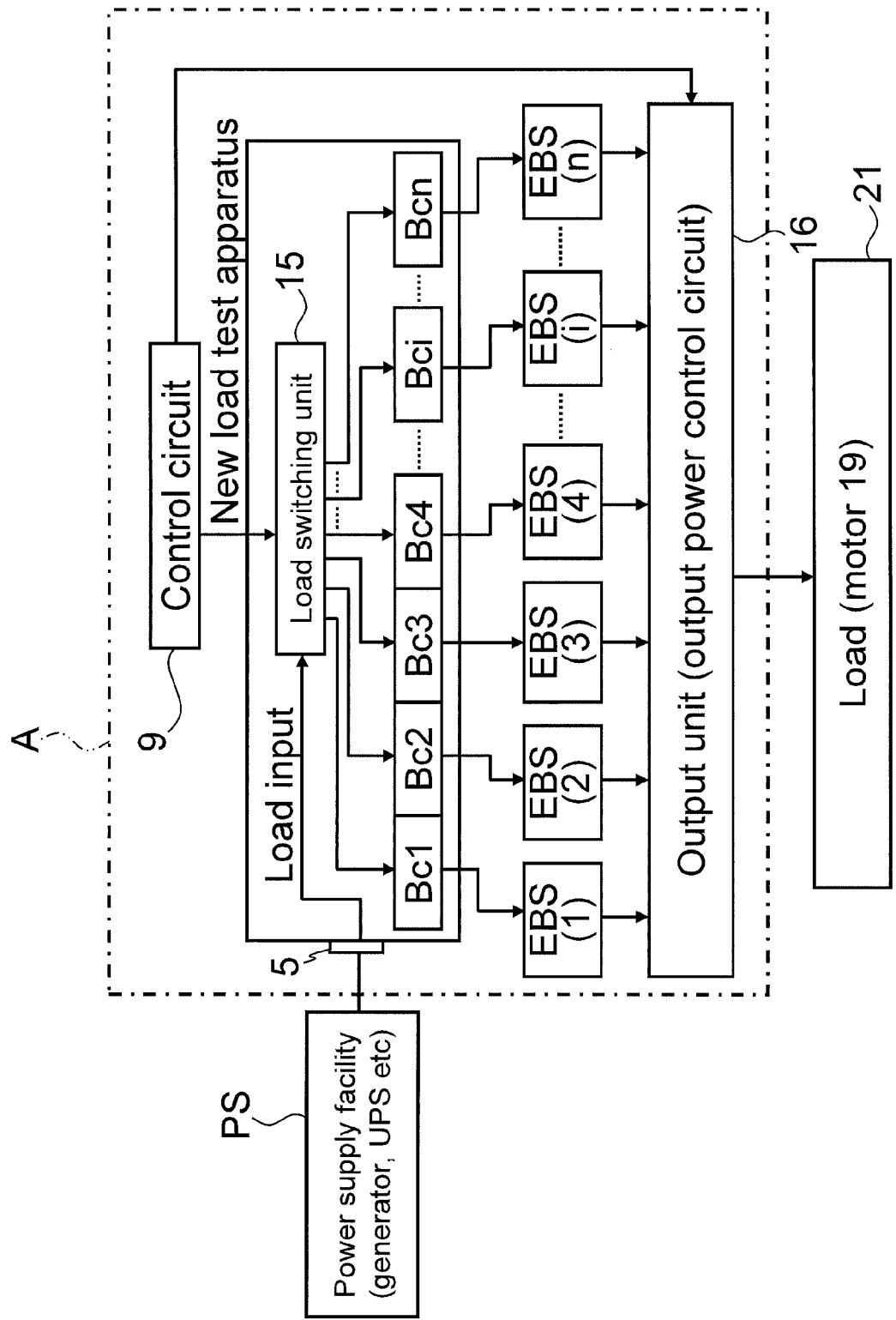
FIG. 12 is a charging circuit diagram of the hybrid car of FIG. 11.

In this embodiment, the electric power from the storage battery EBS(i) is supplied to a load 21, which is a power supplied unit of each unit of the vehicle, via the output power control circuit (output unit) 16 illustrated in FIG. 12. The load 21 includes, for example, the air conditioner, the meter, the lamp, and the motor 19. The output power control circuit (output unit) 16 includes the inverter that supplies the drive power to the motor 19.

The power transmission mechanism that includes the motor 19, the transmission 20, and the like transmits the rotation of the engine 17 to the differential apparatus 18. The configurations and the structures of the power transmission mechanism can employ configuration and structure of power transmission mechanism of the known hybrid car. Thus, detailed description is omitted.

Fourth Embodiment

While in the aforementioned first to third embodiments, the example where only the plurality of storage batteries EBS(i) is used as the load resistance of the load test apparatus A is described, this should not be construed in a limiting sense. For example, the load resistance of the load test apparatus A in the first to third embodiments may have a configuration in combination with the plurality of storage batteries and the resistance unit that includes rod-shaped resistors for the load.

FIGS. 13 to 16 illustrate an example of this configuration. The load resistance of the load test apparatus A may have a configuration in combination with the above-described plurality of storage batteries EBS(i) and the resistance unit (not shown) disclosed in JP 2010-25752 A. Note that reference symbol i is i=0, 1, 3, . . . n.

That is, in the fourth embodiment, a part of the resistance apparatus (heater) Ru(i) of the load test apparatus disclosed in JP 2010-25752 A is replaced by the aforementioned plurality of storage batteries EBS(i).

Figure 13:
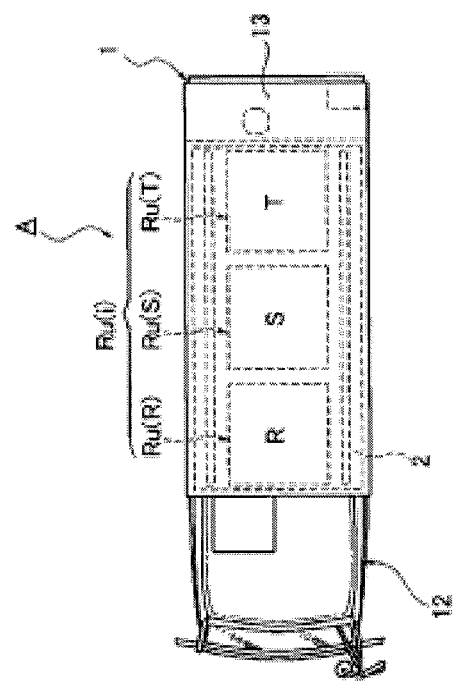
FIG. 13 is a plane view of a vehicle illustrating another example of the load system of FIG. 7.
Figure 14:
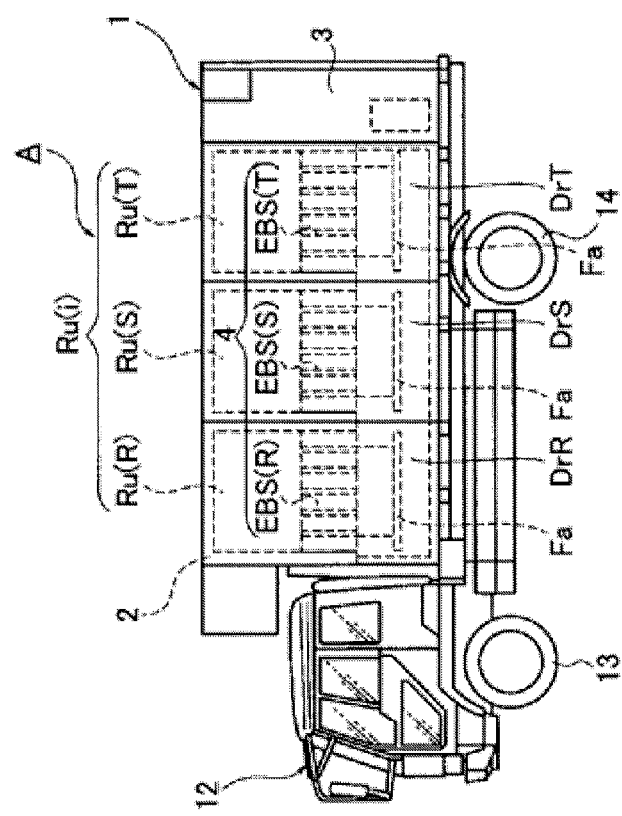
FIG. 14 is a side view of the vehicle of FIG. 13.

In the fourth embodiment, as illustrated in FIGS. 13 and 14, the resistance apparatus Ru(i) includes R-phase, S-phase, and T-phase resistance units Ru(R), Ru(S), and Ru(T) (corresponding to the R-phase, S-phase, and T-phase resistance units denoted by reference numerals 42, 43, and 44 in JP 2010-25752 A). The respective storage battery units EBS(R), EBS(S), and EBS(T) constituted by the storage battery EBS (i) are disposed directly below the resistance units Ru(R), Ru(S), and Ru(T).

Figure 15:
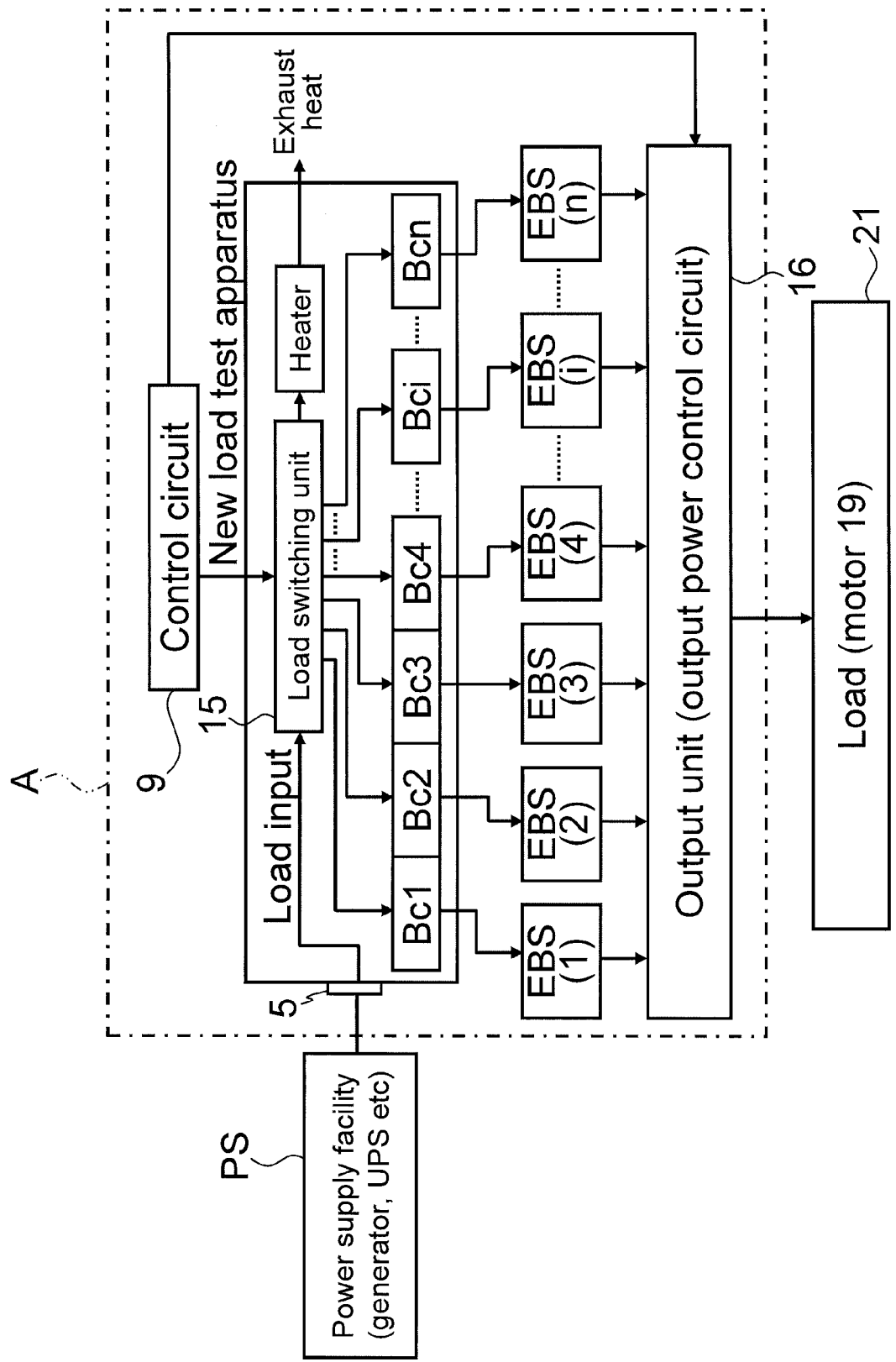
FIG. 15 is a charging circuit diagram of the vehicles of FIGS. 13 and 14.

The control circuit 9 illustrated in FIG. 15 operationally controls the load switching unit 15 to change the connection state of the plurality of rod-shaped resistors (not shown) of the resistance units Ru(R), Ru(S), and Ru(T). Also, the control circuit 9 operationally controls the load switching unit 15 to perform, for example, an on-off control of the plurality of chargers (Bc1, . . . Bci, . . . Bcn). Accordingly, the control circuit 9 changes the connection state of the storage batteries EBS(1), . . . EBS(i), . . . EBS(n) of the storage battery units EBS(R), EBS(S), and EBS(T) so as to perform the load test similarly to JP 2010-25752 A.

In this case, the respective storage batteries EBS(1), . . . EBS(i), . . . EBS(n) of the storage battery units EBS(R), EBS(S), and EBS(T) are charged via the charger (Bc1, . . . Bci, . . . Bcn).

In this embodiment, the electric power from the storage battery EBS(i) is supplied to a load 21, which is the power supplied unit of each unit of the vehicle, via the output power control circuit (output unit) 16 illustrated in FIG. 15. The load 21 includes, for example, the air conditioner, the meter, the lamp, and the motor 19. The output power control circuit (output unit) 16 includes the inverter for supplying the drive power to the motor 19.

The power transmission mechanism that includes the motor 19, the transmission 20, and the like transmits the rotation of the engine 17 to the differential apparatus 18. The configurations and the structures of the power transmission mechanism can employ configuration and structure of power transmission mechanism of the known hybrid car. Thus, detailed description is omitted.

Fifth Embodiment

Figure 16:
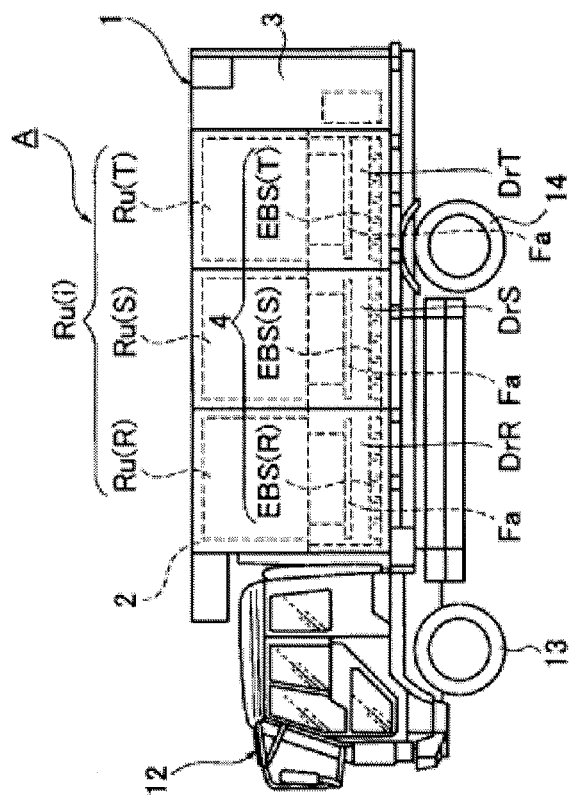
FIG. 16 is an explanatory view where another example of a disposition of the storage battery of FIG. 14 is illustrated.

The storage battery units EBS(R), EBS(S), and EBS(T) in the fourth embodiment may be disposed transverse to the bottom of the load storage case 1 as illustrated in FIG. 16. (Other 1) The power supply for rapid charging is necessary for a high-performance battery of an electric vehicle that moves to the location where the test of power generation apparatus is performed while the load apparatus is mounted on the electric vehicle. The power supply capacity for rapid charging of a mini-sized vehicle with the load apparatus for 100 kW is about three-phase 200 V 50 kW. This capacity is a sufficient load capacity, and ensures labor-saving of 50% and energy savings, thus reducing $CO_2$ significantly. A small power generation apparatus (approximately 10 kW to 100 kW) plays an active part in case of earthquake disaster. It is important to sufficiently perform regular driving while a load of ⅓ or more is periodically (at least once a year) applied to the small power generation apparatus by the load test apparatus to prevent a situation where the small power generation apparatus cannot generate power in an emergency. Here, using a small electric vehicle as a vehicle that carries the test apparatus to the local ensures being environmentally friendly and ensures energy saving. The current electric vehicle can run 200 km mileage on a single full charge. In the case where the travel distance to go to the test (one way 60 km) is within 100 km, the electric vehicle can be fully charged on a single charge (approximately two hours). Even a part of the electric power for the load test can sufficiently cover the electric power for charging the electric vehicle. The battery power supply from the electric vehicle is used for operating the inverter to cover the operating power supply of the load test apparatus. (Other 2) "Application of the load system A to the rapid charging system using a gas engine" A rapid charger has a large capacity. Hence, it is necessary that a high-voltage power receiving facility with very high installation cost be newly provided to receive the electric power transmitted from the power company. In the case where the high-voltage power receiving facility is installed in a gas station, the cost is high. Thus, the spread of the high-voltage power receiving facility is delayed. A generator using a normal gasoline engine causes high $CO_2$ emissions, which is unfavorable to the natural environment, and is not preferred to be used as the charging facility of the vehicle such as the electric vehicle and the hybrid car.

Generators using gas with low $CO_2$ emissions as fuel include a gas engine generator using LPG gas as fuel and a gas engine generator using city gas as fuel. These gas engine generators allow reducing the installation cost to approximately a half the cost of the high-voltage power receiving facility. This facilitates installation of the gas station compared with the high-voltage power receiving facility.

Thus, as illustrated in FIG. 17, the following configuration is preferred. A gas engine generator 200 is installed in a gas station 201. The gas engine generator 200 uses LPG gas or city gas as fuel with low $CO_2$ emissions. The gas engine generator 200 is used for charging the vehicle 10 such as the electric vehicle and the hybrid car. In this case, the gas station 201 includes a fueling apparatus 202 for the vehicle 10 with an engine, for example, a hybrid car. The gas engine generator 200 employs, for example, a generator with a power generation capacity of approximately 80 kW output power. The gas engine generator 200 includes a gas engine E, which uses LPG gas or city gas as fuel with low $CO_2$ emission, and a generator G, which is driven by the gas engine E.

Then, the electric power from the generator G of the gas engine generator 200 is charged to the storage battery EBS of the vehicle 10 such as the electric vehicle and the hybrid car by a rapid charger (a charger with a charging capacity of approximately 50 kW) 203. In the rapid charger 203, the charger (Bc1, . . . Bci, . . . Bcn) of the aforementioned load system A is used as the rapid charger. This load system A may be an installation type or a mobile type movably mounted on the aforementioned vehicle 12. Use of the load system A allows periodically performing the load test of the gas engine generator 200 to periodically examine the performance of the gas engine generator 200. At this time, the storage batteries EBS(1), . . . EBS(i), . . . EBS(n) and the auxiliary storage battery EBS(AX) of the load system A can be charged. In the case where the storage battery EBS of the vehicle 10 is replaceable, the storage batteries EBS(1), . . . EBS(i), . . . EBS(n) and the auxiliary storage battery EBS(AX) charged by the load system A can be replaced by the storage battery EBS of the vehicle 10.

As described above, the load system according to the embodiments of the invention includes the power supply input unit 5, the load, and the control circuit 9. The power supply input unit 5 is for the load test of the external power supply (power supply facility PS). The load includes the storage batteries (storage batteries EBS(1), . . . EBS(i), . . . EBS(n) and auxiliary storage battery EBS(AX)) as a plurality of load resistances connected to the power supply input unit 5. The control circuit 9 selectively switches and connects the plurality of load resistances to the power supply input unit 5.

This configuration can reduce electric power energy wastefully consumed in the load test.

The load in the load system according to the embodiments of the invention further includes the plurality of resistors (resistance apparatus Ru(i)) as the plurality of load resistances.

With this configuration, the plurality of resistors (resistance apparatus Ru(i)) is disposed as the plurality of load resistances. This performs the load test with the resistor (resistance apparatus Ru(i)) and the storage batteries EBS(1), ... EBS(i), ... EBS(n) and EBS(AX). This also allows keeping a reserve of the resistor (resistance apparatus Ru(i)) even in the case where the storage batteries EBS(1), ... EBS(i), ... EBS(n) and EBS(AX) are fully charged. Thus, the load test can be performed with the resistor (resistance apparatus Ru(i)) only.

The load system according to the embodiments of the invention includes the output power control circuit 16 connected to the control circuit 9 to allow power supply.

With this configuration, the output power control circuit 16 can use the storage batteries EBS(1), ... EBS(i), ... EBS(n) and EBS(AX) as the power supply. Thus, external power supply for the load system is not necessary.

In the load system according to the embodiments of the invention, the load storage case 1 including the load storage unit 2 and the control panel 3 is disposed. The storage batteries (EBS(1), ... EBS(i), ... EBS(n) and EBS(AX)) are removably disposed in the load storage unit 2 of the load storage case 1. Also, the power supply input unit 5 is disposed in the control panel 3.

With this configuration, the charged storage batteries (EBS(1), ... EBS(i), ... EBS(n) and EBS(AX)) may be extracted from the load system, and used as the power supply for other devices or apparatuses.

In the load system according to the embodiments of the invention, the storage batteries (EBS(1), ... EBS(i), ... EBS(n) and EBS(AX)), the control circuit 9, and the power supply input unit 5 are mounted on the vehicle 12.

This configuration allows performing the load test after moving to the desired location for the load test, and allows charging the storage battery (EBS(1), ... EBS(i), ... EBS(n) and EBS(AX)) during the load test.

In the load system according to the embodiments of the invention, the load mounted on the vehicle further includes the plurality of resistors (resistance apparatus Ru(i)) as the load resistance.

With this configuration, the plurality of resistors (resistance apparatus Ru(i)) as the plurality of load resistances are mounted on the vehicle with the storage batteries EBS(1), ... EBS(i), ... EBS(n) and EBS(AX). This performs the load test with the resistor (resistance apparatus Ru(i)) and the storage batteries EBS(1), ... EBS(i), ... EBS(n) and EBS(AX) after moving to the desired location for the load test. This also allows keeping the reserve of the resistor (resistance apparatus Ru(i)) in the case where the storage batteries EBS(1), ... EBS(i), ... EBS(n) and EBS(AX) are fully charged. Thus, the load test can be performed with the resistor (resistance apparatus Ru(i)) only.

In the load system according to the embodiments of the invention, the storage batteries (EBS(1), ... EBS(i), ... EBS(n) and EBS(AX)) are used as the battery for supplying the electric power to the power supplied unit (wheel drive motors M1 and M2) of the vehicle 12.

With this configuration, the storage batteries (EBS(1), ... EBS(i), ... EBS(n) and EBS(AX)) can be used as the power supply for the power supplied unit (wheel drive motors M1 and M2) of the vehicle. Thus, it is unnecessary to dispose a dedicated battery in the vehicle.

In the load system according to the embodiments of the invention, the vehicle 12 includes the motor (the wheel drive motors M1 and M2) to the drive wheels (13, 14) as the power supplied unit. The batteries (storage battery EBS(1), ... EBS(i), ... EBS(n) and EBS(AX)) of the vehicle are used as a drive power supply for the motor (wheel drive motors M1 and M2).

With this configuration, the storage batteries (EBS(1), ... EBS(i), ... EBS(n) and EBS(AX)) can be used as the power supply of the wheel drive motors M1 and M2 that drive the wheels 13 and 14 of the vehicle. Also, having the entire capacity of the storage batteries (EBS(1), ... EBS(i), ... EBS(n) and EBS(AX)) larger ensures an extended mileage of the vehicle.

In the load system according to the embodiments of the invention, the storage batteries (EBS(1), ... EBS(i), ... EBS(n) and EBS(AX)) are removably attached to the vehicle 12.

With this configuration, the charged storage batteries (EBS(1), ... EBS(i), ... EBS(n) and EBS(AX)) are extracted from the load system of the vehicle, and used as the power supply of other devices or apparatuses.

In the load system according to the embodiments of the invention, the load storage case 1 including the load storage unit 2 and the control panel 3 is disposed in the vehicle 12. The storage batteries (EBS(1), ... EBS(i), ... EBS(n) and EBS(AX)) are removably disposed in the load storage unit 2 of the load storage case 1. Also, the power supply input unit 5 is disposed in the control panel 3.

With this configuration, a configuration element necessary for the load test can be disposed in the load storage case 1.

The invention claimed is:

1. A load system, comprising:
    a power supply input unit for load test of an external power supply;
    a charging circuit or a charger to which electric power from the power supply is supplied via the power supply input unit;
    a plurality of loads to which the electric power from the charging circuit or the charger is supplied; and
    a control circuit that switches selectively and connects the plurality of loads to the charging circuit or the charger,
    wherein the plurality of loads is a plurality of storage batteries as a load resistance, and
    the control circuit is configured to switch selectively and connect the plurality of storage batteries to the charging circuit or the charger such that the storage battery connected to the charging circuit or the charger among the plurality of storage batteries is charged by the charging circuit or the charger.

2. The load system according to claim 1,
    wherein the storage battery includes a secondary battery and an auxiliary storage battery;
    wherein the charging circuit includes a rapid charging circuit used for a rapid charging of the secondary battery, and a small-capacity charging circuit used for a charging of the auxiliary storage battery; and
    wherein the small-capacity charging circuit performs a fine adjustment of voltage and current, which are charged by the rapid charging circuit.

3. The load system according to claim 1, further comprising:
    a charger connected to each of the plurality of storage batteries; and a load switching unit to which the electric power from the power supply is input via the power supply input unit, wherein the load switching unit is configured to be operationally controlled by the control circuit to switch the charger and supply charging voltage and charging current to the storage battery connected to the charger.

4. The load system according to claim 1,
wherein the load further includes a plurality of resistors as a plurality of load resistances.

5. The load system according to claim 1, comprising
an output power control unit connected to the control circuit so as to allow supplying power to the control circuit.

6. The load system according to claim 1, comprising
a load storage case that includes a load storage unit and a control panel,
wherein the storage battery is removably disposed in the load storage unit of the load storage case, and
the power supply input unit is disposed in the control panel.

7. The load system according to claim 1,
wherein the storage battery, the control circuit, and the power supply input unit are mounted on a vehicle.

8. The load system according to claim 7,
wherein the load mounted on the vehicle further includes a plurality of resistors as a load resistance.

9. The load system according to claim 8,
wherein the storage battery is used as a battery to supply electric power to a power supplied unit of the vehicle.

10. The load system according to claim 8,
wherein the storage battery is removably attached to the vehicle.

11. The load system according to claim 7,
wherein the storage battery is used as a battery to supply electric power to a power supplied unit of the vehicle.

12. The load system according to claim 11,
wherein the vehicle includes a motor that drives a wheel as the power supplied unit, and
the battery of the vehicle is used as a drive power supply of the motor.

13. The load system according to claim 7,
wherein the storage battery is removably attached to the vehicle.

14. The load system according to claim 13,
wherein a load storage case that includes a load storage unit and a control panel is disposed on the vehicle,
the storage battery is removably disposed in the load storage unit of the load storage case, and
the power supply input unit is disposed in the control panel.

* * * * *